(12) United States Patent
Lin

(10) Patent No.: US 11,653,556 B2
(45) Date of Patent: May 16, 2023

(54) FLEX-TOLERANT STRUCTURE, AND DISPLAY PANEL USING SAME

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Po-Ching Lin, Chengdu (CN)

(73) Assignees: Interface Technology (ChengDu) Co, Ltd., Chengdu (CN); INTERFACE OPTOELECTRONICS (SHENZHEN) CO, LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 246 days.

(21) Appl. No.: 16/844,361

(22) Filed: Apr. 9, 2020

(65) Prior Publication Data
US 2021/0202867 A1 Jul. 1, 2021

(30) Foreign Application Priority Data
Dec. 30, 2019 (CN) .......................... 201911394830.6

(51) Int. Cl.
| | | |
|---|---|---|
| H01L 51/00 | (2006.01) | |
| H01L 51/52 | (2006.01) | |
| H01L 51/56 | (2006.01) | |
| G09F 9/30 | (2006.01) | |
| G09G 3/3225 | (2016.01) | |

(52) U.S. Cl.
CPC ......... *H10K 77/111* (2023.02); *G09G 3/3225* (2013.01); *H10K 59/131* (2023.02); *H10K 85/221* (2023.02); *G09G 2380/02* (2013.01)

(58) Field of Classification Search
CPC ............... H01L 27/3276; H01L 27/323; H01L 51/0097; H01L 51/0048; G09G 2380/02; G09G 3/035; G09G 9/301; G09G 2300/043; G09G 2310/0232; G09G 2354/00; G09F 9/301; H10K 77/111; H10K 59/131; H10K 85/221; H10K 59/40
See application file for complete search history.

(56) References Cited

U.S. PATENT DOCUMENTS

| | | | | |
|---|---|---|---|---|
| 9,195,358 | B1 * | 11/2015 | Cok ...................... | G06F 1/1643 |
| 9,807,876 | B2 * | 10/2017 | Catchpole ............. | G06F 1/1652 |
| 2002/0066904 | A1 * | 6/2002 | Yuan ..................... | H01L 31/167 |
| | | | | 438/22 |

(Continued)

FOREIGN PATENT DOCUMENTS

BR      10 2012 015545 A2  *  8/2014

OTHER PUBLICATIONS

Translation of BR 10 2012 015545 (Year: 2014).*

*Primary Examiner* — Mary A Wilczewski
*Assistant Examiner* — Tsz K Chiu
(74) *Attorney, Agent, or Firm* — ScienBiziP, P.C.

(57) ABSTRACT

A flex-tolerant structure includes a flexible and foldable substrate and traces on the substrate. Each trace includes a stretch-resistant layer and a metal layer covering the stretch-resistant layer, electrical flow can persist through these layers even if the traces are fractured. A display panel is also disclosed.

6 Claims, 18 Drawing Sheets

(56) References Cited

U.S. PATENT DOCUMENTS

| | | | | |
|---|---|---|---|---|
| 2007/0181944 A1* | 8/2007 | Macpherson | ....... | H01L 27/3283 |
| | | | | 257/344 |
| 2013/0193415 A1* | 8/2013 | Choi | .................. | H10K 59/131 |
| | | | | 257/40 |
| 2014/0306260 A1* | 10/2014 | Yamazaki | .............. | H10K 59/40 |
| | | | | 257/99 |
| 2015/0021570 A1* | 1/2015 | Kim | .................... | H01L 51/5293 |
| | | | | 257/40 |
| 2015/0177789 A1* | 6/2015 | Jinbo | .................... | G06F 1/1652 |
| | | | | 313/511 |
| 2015/0356926 A1* | 12/2015 | Bae | ...................... | H10K 59/131 |
| | | | | 345/82 |
| 2016/0103537 A1* | 4/2016 | Park | .................... | G06F 3/04164 |
| | | | | 345/174 |
| 2016/0209877 A1* | 7/2016 | Chong | ................. | H10K 77/111 |
| 2016/0271914 A1* | 9/2016 | Xie | ..................... | H01L 51/0097 |
| 2017/0371184 A1* | 12/2017 | Shtukater | ........... | G02B 27/0172 |
| 2018/0012549 A1* | 1/2018 | Lee | ........................ | H01L 27/323 |
| 2018/0068613 A1* | 3/2018 | Chung | ................. | G09G 3/3208 |
| 2018/0069192 A1* | 3/2018 | Ando | ................... | H01L 51/5246 |
| 2018/0090701 A1* | 3/2018 | Senda | ................. | H01L 51/0097 |
| 2018/0197484 A1* | 7/2018 | Moon | .................... | H01L 27/12 |
| 2019/0341566 A1* | 11/2019 | Lee | ........................ | G06F 1/1652 |
| 2020/0119305 A1* | 4/2020 | Kwon | ................. | H01L 51/5253 |
| 2020/0136066 A1* | 4/2020 | Jin | ..................... | H01L 51/5253 |

* cited by examiner

FLEX-TOLERANT STRUCTURE, AND DISPLAY PANEL USING SAME

FIELD

The subject matter herein generally relates to displays, specifically a flex-tolerant structure and a display panel.

BACKGROUND

Generally, a display panel defines a display area for displaying images and a binding area for binding with a driving circuit. In order to realize a narrow border of the display panel, a bent or folded structure is used to fold the driving circuit in the binding area to a side of the display panel away from its display surface. However, the electrical traces on such structure may be broken and faulty.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
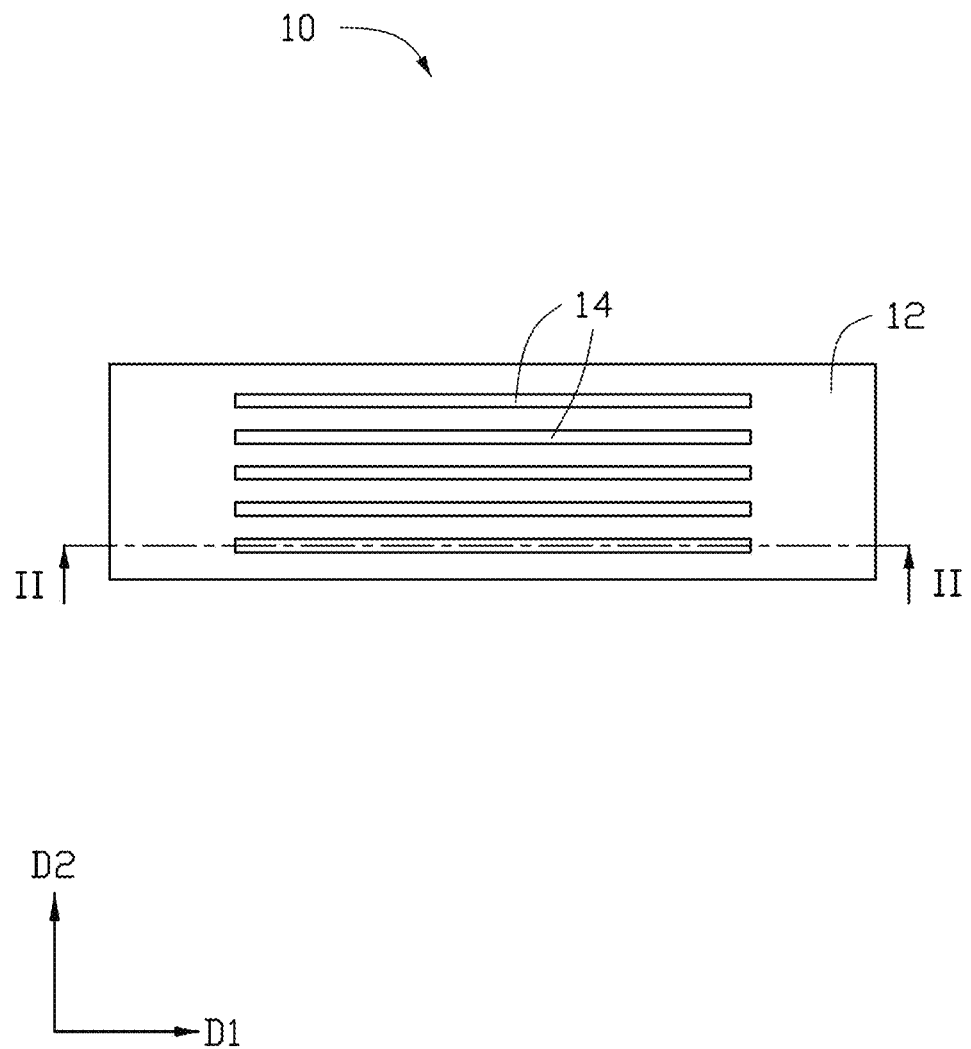
FIG. 1 is a top view of a flex-tolerant structure according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

FIG. 1 shows a flex-tolerant structure 10 according to an embodiment. As shown in FIG. 1, the flex-tolerant structure 10 includes a substrate 12 and a plurality of traces 14 on a surface of the substrate 12. Each trace 14 extends along a first direction D1. The traces 14 are spaced apart and electrically insulated from each other along a second direction D2. The second direction D2 intersects with the first direction D1. The number, shape, extension direction and arrangement of the traces 14 can be adjusted according to actual needs. In one embodiment, the flex-tolerant structure 10 is a flexible circuit board. In other embodiments, the flex-tolerant structure 10 is a flexible display panel, as shown in FIG. 12 through FIG. 18.

The substrate 12 is flexible and deformable. The material of the substrate 12 can be polyimide (PI), polyamide (PA), polycarbonate (PC), polyphenylether sulfone (PES), polymeric methyl methacrylate (PMMA), polyethylene glycol terephthalate (PET), or cycloolefin copolymer, COC).

Figure 2:
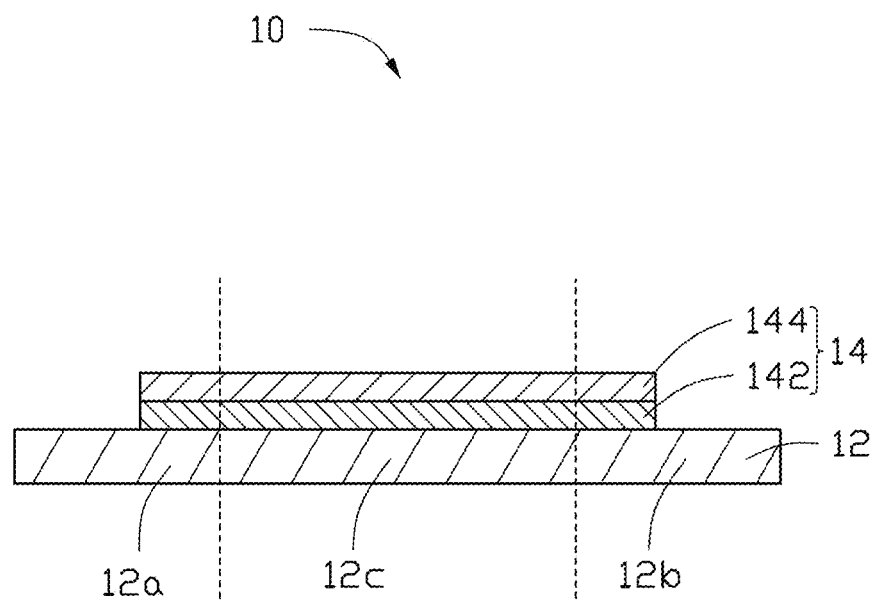
FIG. 2 is a cross-sectional view along line II-II of FIG. 1.

As shown in FIG. 2, the substrate 12 defines a first non-bending area 12a, a second non-bending area 12b, and a foldable area 12c connecting and between the first and second non-bending areas 12a and 12b. Each trace 14 includes a stretch-resistant layer 142 and a metal layer 144 covering the stretch-resistant layer 142. The metal layer 144 completely covers a surface of the stretch-resistant layer 142 away from the substrate 12. The traces 14 or some at least are contained in the foldable area 12c.

Figure 3:
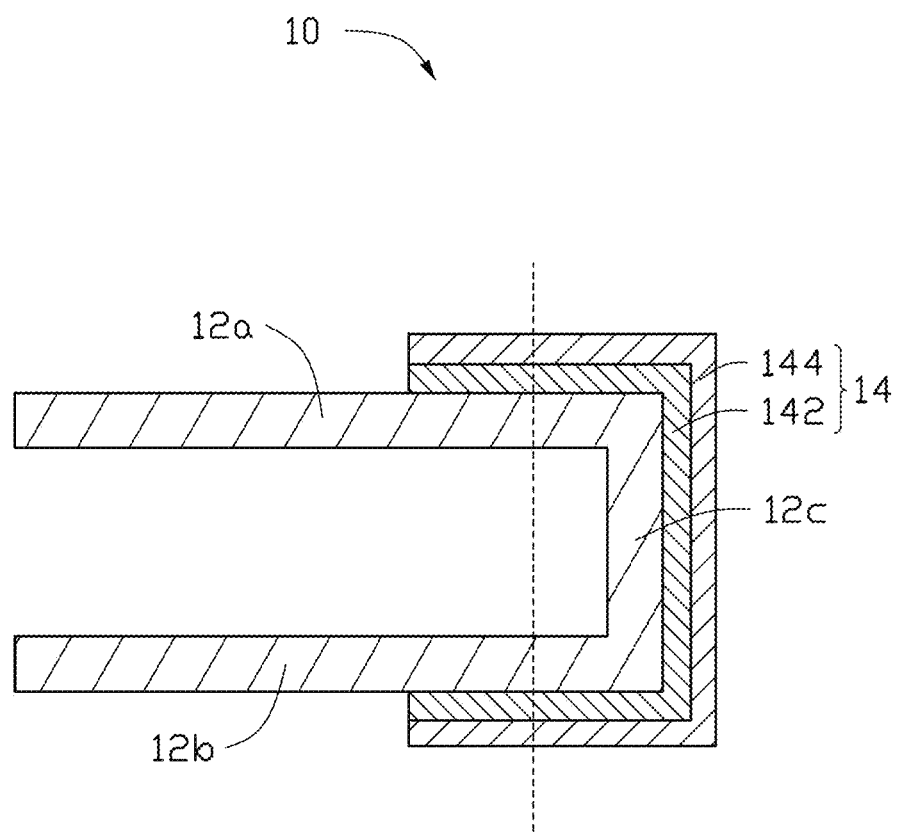
FIG. 3 is a cross-sectional view of the structure of FIG. 1 when folded.

As shown in FIG. 3, the substrate 12 is bent in the foldable area 12c along the length direction (first direction D1) of the traces 14, and the traces 14 will be bent as the substrate 12 is bent. The foldable area 12c has a substantially "C" shape after bending, and the first and second non-foldable areas 12a and 12b are opposite to each other after bending. The traces 14 in the first non-bending area 12a and the traces 14 in the second non-bending area 12b are arranged back-to-back.

In other embodiments, the bending direction of the substrate 12 is unlimited. For example, the substrate 12 can be bent along the width direction of the trace 14s (the second direction D2), or after the substrate 12 is bent, the traces 14 in the first non-bending area 12a and the traces 14 in the second non-bending area 12b are arranged face-to-face.

In one embodiment, the material of the stretch-resistant layer 142 is a composite material of metal and polymer, such as conductive silver paste. The material of the metal layer 144 can be, but is not limited to, copper or copper alloy. In other embodiments, the stretch-resistant layer 142 can be, but is not limited to, carbon nanotubes (CNTs), nano metals (such as nano silver), conductive polymers (PEDOT), composites of CNTs and PEDOT, composites of nano metals and PEDOT, or composites of nano metals and graphene.

In one embodiment, the stretch-resistant layer 142 is formed by screen printing or laser patterning. The metal layer 144 is formed by chemical plating, electroplating, or sputtering combined with a yellow light process.

Figure 4:
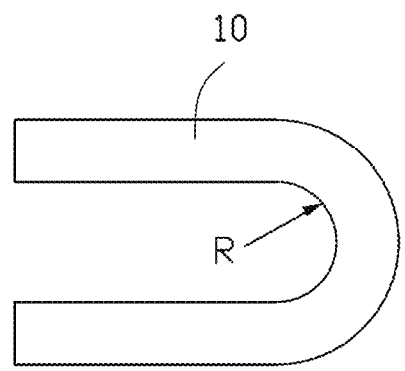
FIG. 4 is a schematic diagram showing the flex-tolerant structure in a bending test according to an embodiment of the present disclosure.

As shown in FIG. 4, the flex-tolerant structure 10 is substantially in "C"-shaped after bending. In one embodiment, a bending test is carried out on the flex-tolerant structure 10 with a bending radius R of 1 mm. After bending a number of different times, the change rate of resistance and appearance change are examined. As a comparative example, the bending test of a bending structure according to prior art is also carried out with a bending radius R of 1 mm.

Figure 5:
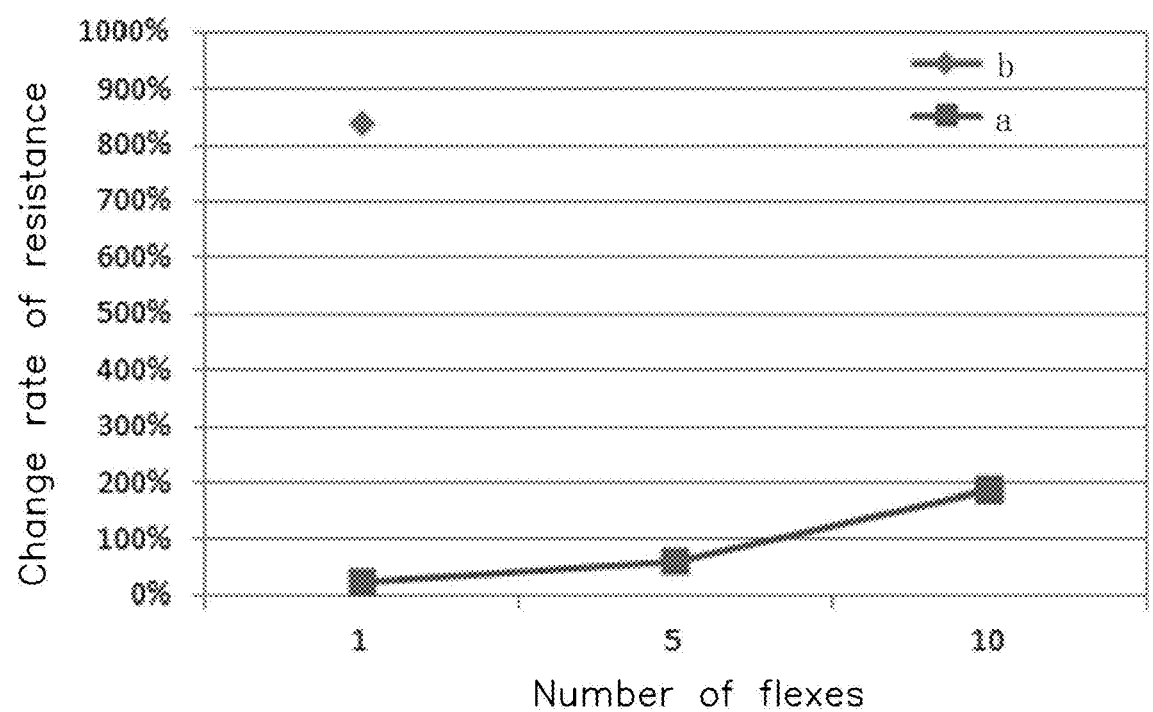
FIG. 5 is a diagram showing relationships between a change rate of resistance and number of flexes of the flex-tolerant structure of an embodiment according to the present disclosure and a prior art.

In FIG. 5, the broken line a represents a relationship between the change rate of resistance and number of flexes of the flex-tolerant structure 10 in the bending test.

Figure 6:
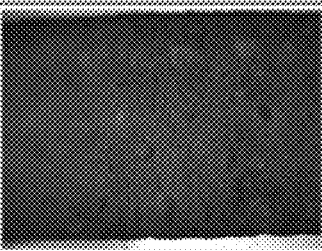
FIG. 6 are photographs showing relationships between change in appearance and number of flexes in the bending test of the flex-tolerant structure according to an embodiment of the present disclosure.

As shown in FIG. 5, even after the substrate 12 is bent many times, the change rate of resistance of the substrate 12 is still small. After the substrate 12 is bent 10 times, the change rate of resistance is about 200%. As shown in FIG. 6, after the substrate 12 is bent 10 times, the traces 14 have cracks on the metal layer 144 side. However, since the stretch-resistant layer 142 under the metal layer 144 has good tensile resistance, the traces 14 maintain their conductivity through the stretch-resistant layer 142 at cracks of the metal layer 144. The reliability of the traces 14 is improved, and the phenomenon that the traces 14 are broken during the bending process and cannot conduct is avoided. In addition, even after repeated bending, the resistance of the traces 14 does not change much, and electrical flow is stable.

Figure 7:
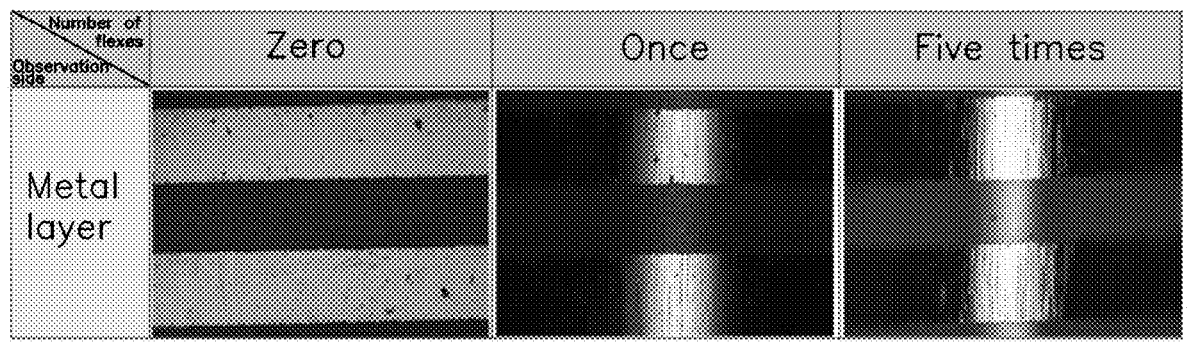
FIG. 7 are photographs showing relationships between appearance change and number of flexes of the structure in bending test of the prior art.

In FIG. 5, the broken line b represents the relationship between the change rate of resistance and the number of flexes of a bending structure according to prior art (the electrical traces of the bending structure are made of a single metal layer). FIG. 7 shows the relationship between the appearance change and number of flexes of the bending structure in the bending test according to prior art.

As shown in FIG. 5 and FIG. 7, in prior art (broken line a), after the substrate is bent once, the change rate of resistance is as high as 800%, and after the substrate is bent five times, obvious cracks have been found in the traces (as shown in FIG. 7), which cannot conduct (in FIG. 5, the change rate of resistance cannot be measured).

Figure 8:
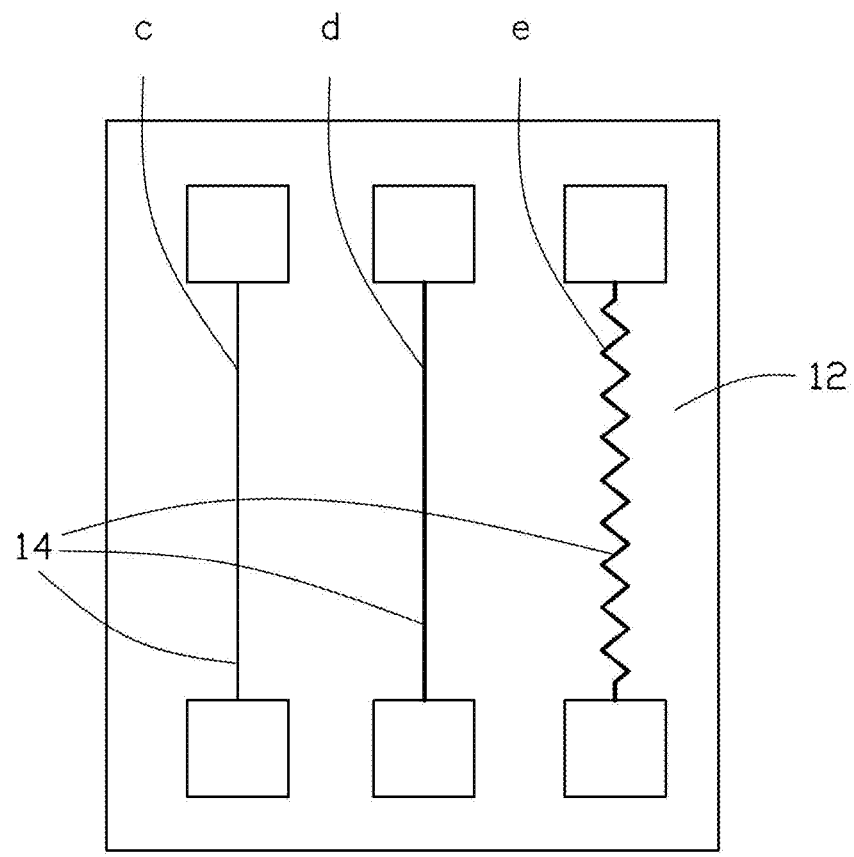
FIG. 8 is a schematic diagram of a tensile test of the unstretched flex-tolerant structure according to an embodiment of the present disclosure.

FIG. 8 is a schematic diagram of tensile test of the unstretched flex-tolerant structure 10 according to an embodiment. There are three traces 14 on the substrate 12, which are traces c, d and e. In one embodiment, the material of the substrate 12 is PC. The trace c is a straight line segment with a line width of 0.5 mm, the trace d is a straight line segment with a line width of 1.0 mm, and the trace e is a roughly zigzag segment with a line width of 1.0 mm.

Figure 9:
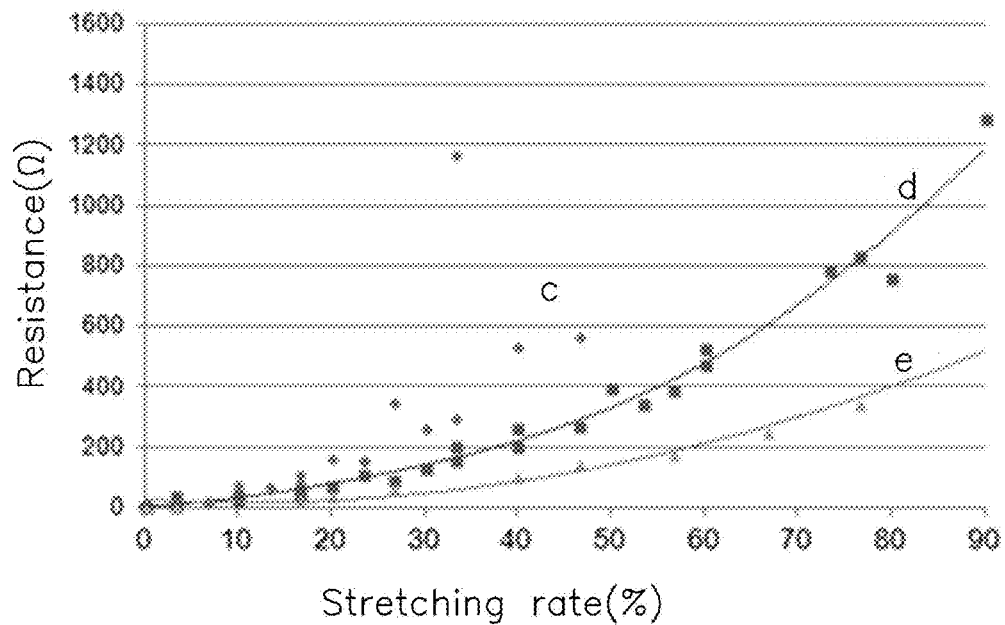
FIG. 9 shows schematic diagrams of tensile rate vs. resistance of the flex-tolerant structure of the present disclosure in the tensile test illustrated in FIG. 8.

As shown in FIG. 9, when the stretching rates of traces c, d and e is greater than 90%, the resistance of traces c, d and e can each be detected. That is, the traces c, d, and e are not broken when the stretching rate is not less than 90%. In addition, as shown in FIG. 8 and FIG. 9, the stretching rate and change rate of resistance of trace c are better than those of trace d and trace e.

Figure 10:
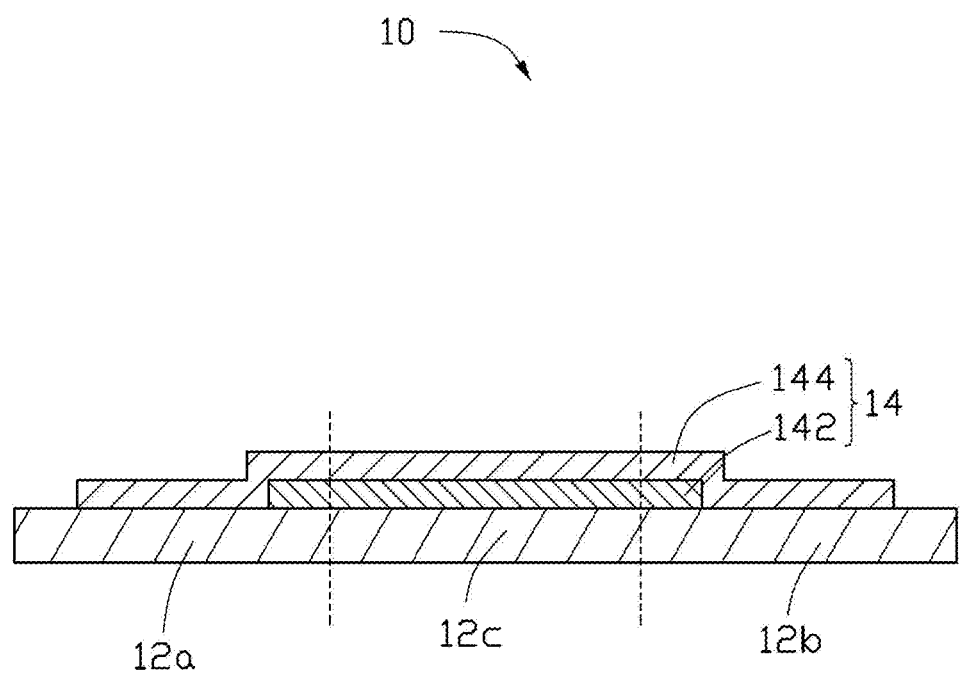
FIG. 10 is a cross-sectional view of a flex-tolerant structure according to another embodiment of the present disclosure.

FIG. 10 shows a bending-resistant structure 10 according to another embodiment. As shown in FIG. 10, in the flex-tolerant structure 10, at least some of the stretch-resistant layer 142 is in the foldable area 12c. The metal layer 144 extends beyond the stretch-resistant layer 142 and covers the surface of the substrate 12. That is, the metal layer 144 covers all surfaces of the stretch-resistant layer 142 that are not in contact with the substrate 12 and layer 144 extends beyond the stretch-resistant layer 142.

Figure 11:
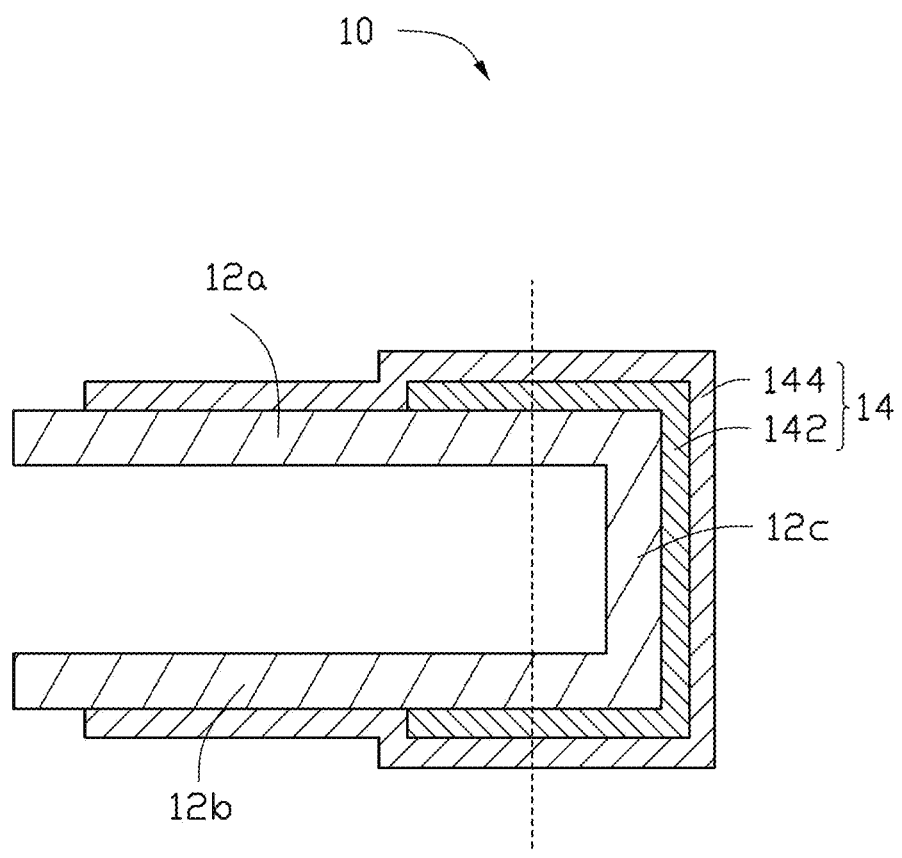
FIG. 11 is a schematic diagram of the flex-tolerant structure of FIG. 10 in a bent or folded state.

As shown in FIG. 11, after the substrate 12 is bent in the foldable area 12c, the traces 14 are bent along with the bending of the substrate 12. The first and second non-bending areas 12a and 12b are opposite to each other after being bent. The traces 14 in the first and second non-bending areas 12a and 12b may have a section including the metal layer 144 and not including the stretch-resistant layer 142. That is, the stretch-resistant layer 142 is arranged at least in the foldable area 12c, so as to improve the flex-toleration of the traces 14 in the foldable area 12c.

Figure 12:
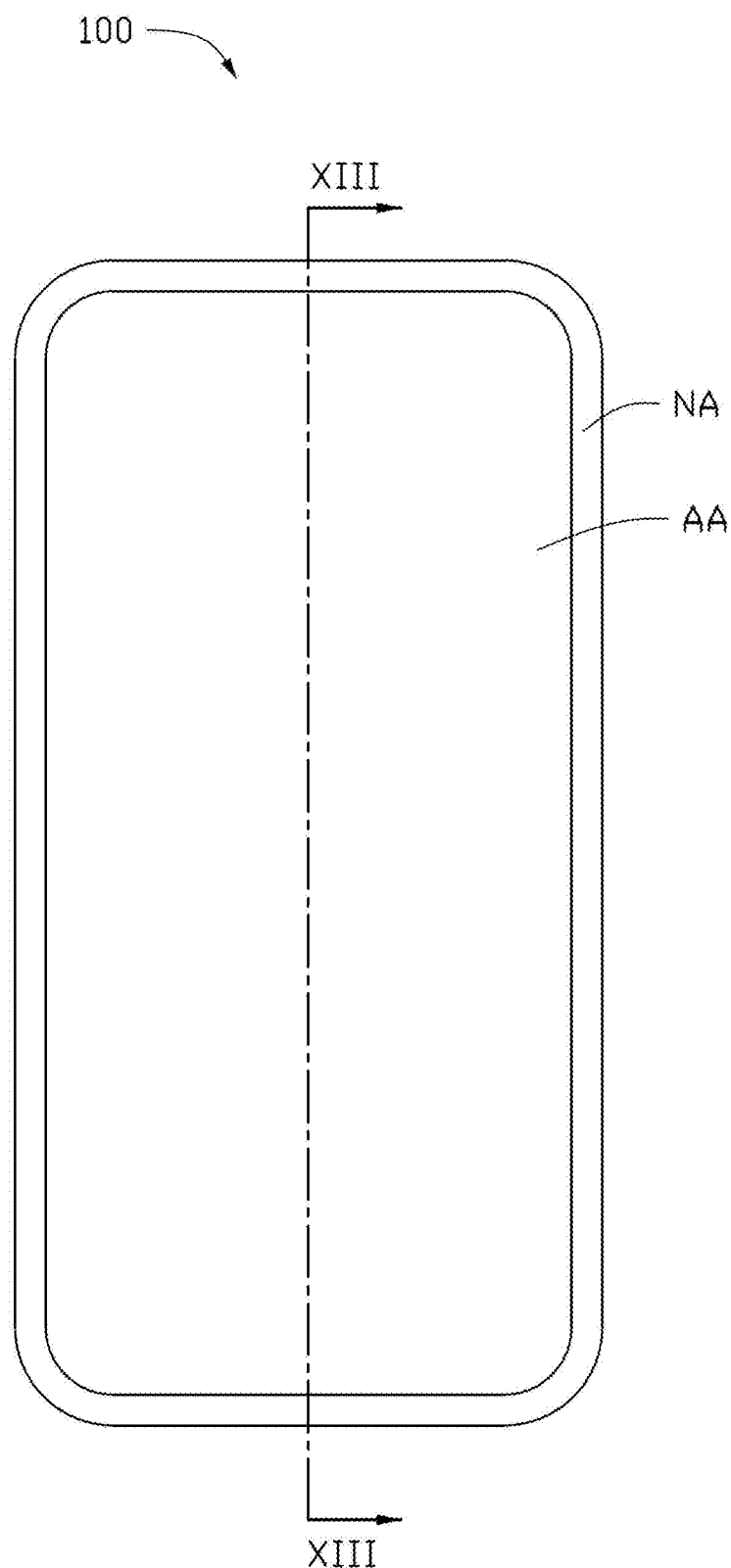
FIG. 12 is a top view of a display panel according to an embodiment of the present disclosure.

FIG. 12 shows a display panel 100 according to an embodiment. The display panel 100 defines a display area AA for displaying images and a border area NA surrounding the display area AA. The border area NA is used to set the traces 14. The display panel 100 may be, for example, a mobile phone, a tablet computer, a smart wearable device (such as a smart watch), and the like.

Figure 13:
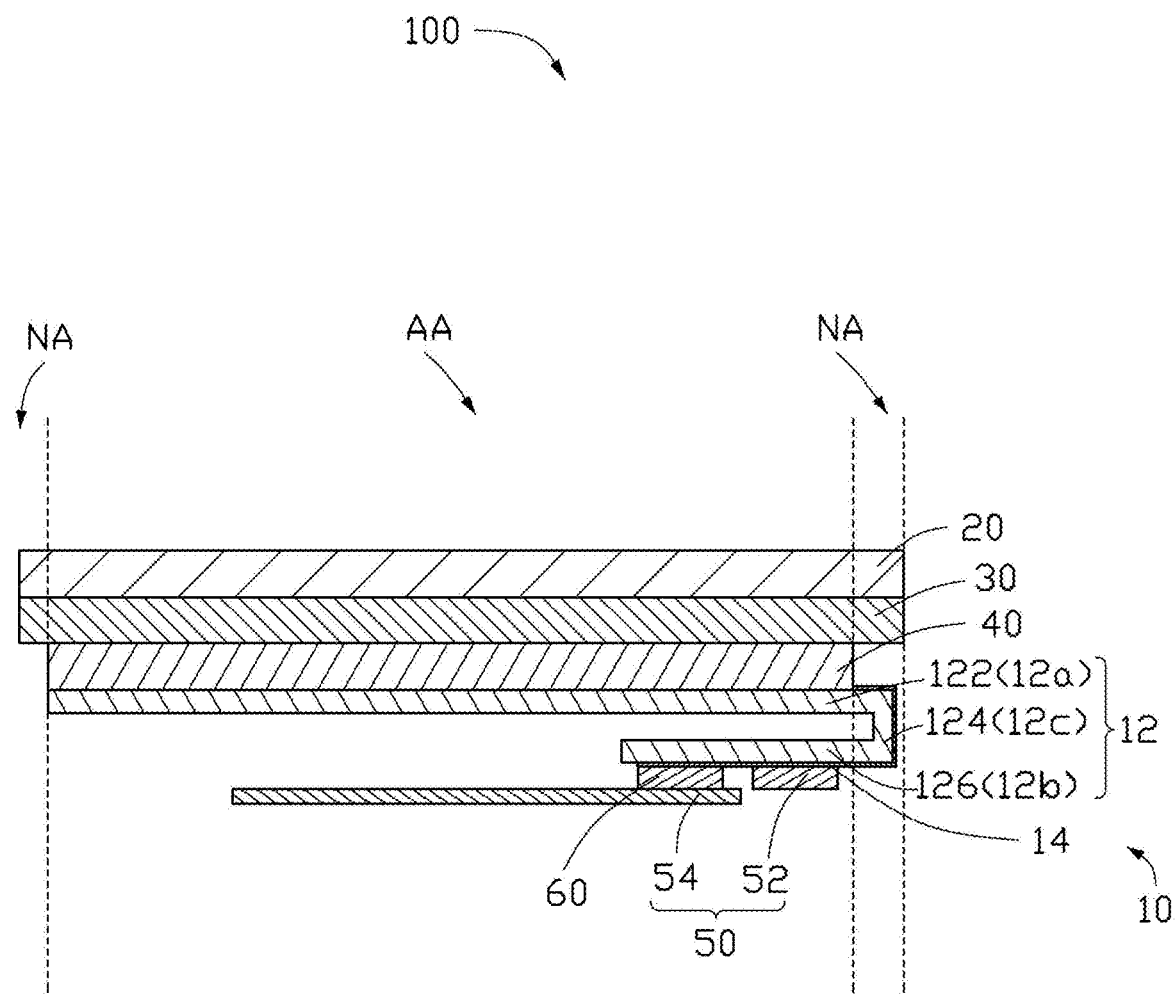
FIG. 13 is a cross-sectional view along line XIII-XIII of FIG. 12.

As shown in FIG. 13, the display panel 100 includes a cover plate 20, a touch layer 30, an organic light emitting device layer 40, a flex-tolerant structure 10, a driving circuit 50, and a conductive adhesive 60.

The substrate 12 is on the cover plate 20. The substrate 12 includes a main portion 122 (the first non-bending area 12a), a bendable portion 124 (the foldable area 12c), and a binding portion 126 (the second non-bending area 12b). The main portion 122 is in the display area AA. The bendable portion 124 extends from the main portion 122 and is in the border area NA. The binding portion 126 connects the bendable portion 124 and is on a side of the main portion 122 away from the cover plate 20. The organic light emitting device layer 40 is on a surface of the main portion 122 close to the cover plate 20. The driving circuit 50 is on a surface of the binding portion 126 away from the cover plate 20. The touch layer 30 is between the organic light emitting device layer 40 and the cover plate 20 and is in the display area AA and the border area NA. The traces 14 are at least on a surface of the bendable portion 124 away from the display area AA. The traces 14 are electrically connected to the organic light emitting device layer 40 and the driving circuit 50.

In one embodiment, the organic light emitting device layer 40 includes an organic light emitting diode (OLED) array layer and a thin film transistor (TFT) array layer. The OLED array layer includes a lower electrode layer (not shown), an organic light emitting layer (not shown) and an upper electrode layer (not shown) on the substrate 12. The organic light emitting layer may include an electron transport layer, an organic material layer, a hole transport layer, a hole injection layer, and the like. When a voltage difference is formed between the lower electrode layer and the lower electrode layer, the organic light emitting layer emits light, and the display panel 100 displays images.

In an embodiment, the touch layer 30 includes a self-capacitive touch sensing structure or a mutual-capacitive touch sensing structure. When a conductive object (e.g., a finger) touches the cover plate 20, a difference occurs in the capacitance sensing signal in the area. After the capacitance sensing signal is processed and converted, a relative position of the touch point is obtained.

In one embodiment, the touch layer 30 is flexible and foldable. The material of the self-capacitive touch sensing structure or the mutual-capacitive touch sensing structure can be conductive materials with good flex resistance, such as metal mesh, nano silver wires, nano copper wires, carbon nanotubes, graphene, conductive polymer, and other conductive materials with high flex toleration.

In one embodiment, the drive circuit 50 includes a driving chip 52 or a flexible circuit board 54. The driving circuit 50 is electrically connected to the organic light emitting device layer 40 through the traces 14 to drive the display panel 100. In FIG. 13, the driving chip 52 is bound to the substrate 12 by means of a chip on film (COF). The flexible circuit board 54 is bound to the binding portion 126 through the conductive adhesive 60, and is electrically connected with the traces 14.

Since the display panel 100 uses a flexible and folded substrate 12, and the driving chip 52 is integrated on the substrate 12 by means of COF, and the binding portion 126 is bent to the side of the display panel 100 away from its display surface, the frame area NA is narrow, and a screen-to-body ratio of the display panel 100 is increased.

Figure 14:
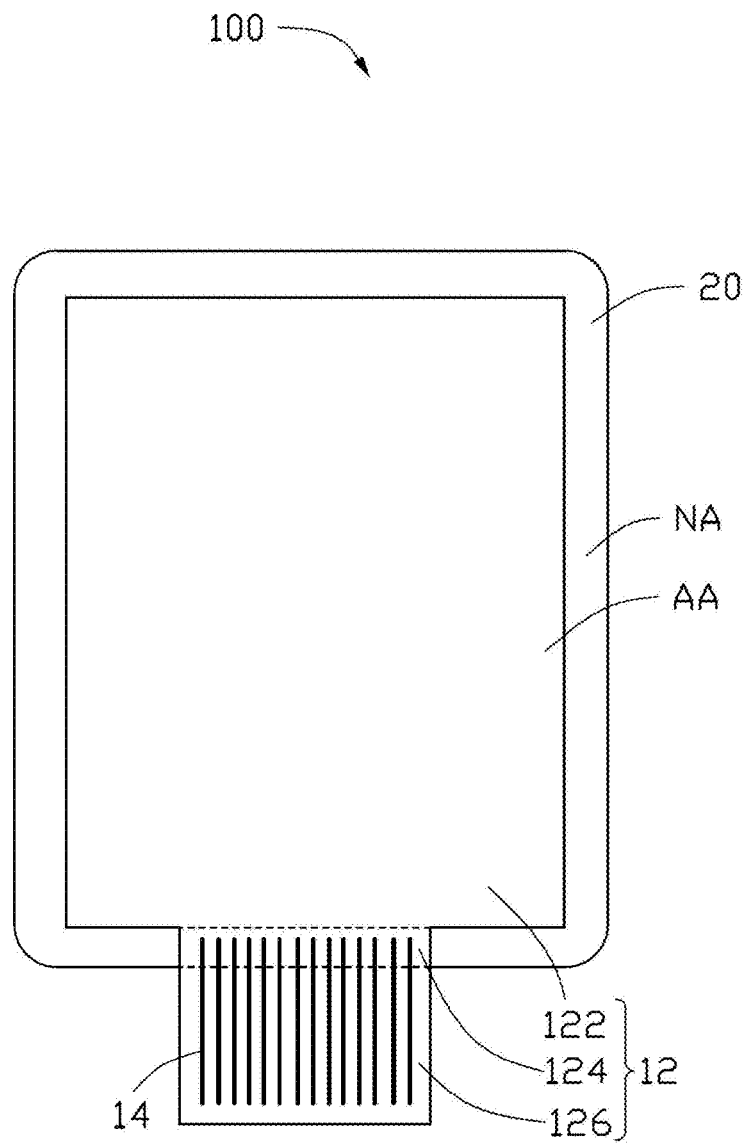
FIG. 14 is a top view of the display panel in FIG. 13 when the substrate is not bent.

FIG. 14 shows the display panel 100 in FIG. 13 when the substrate 12 is not bent. As shown in FIG. 14, the traces 14 are on the surfaces of the bent portion 124 and the binding portion 126 of the substrate 12. The main portion 122 of the substrate 12 has a substantially rectangular shape as large as the display area AA. The bendable portion 124 extends from an edge of the main portion 122.

Figure 15:
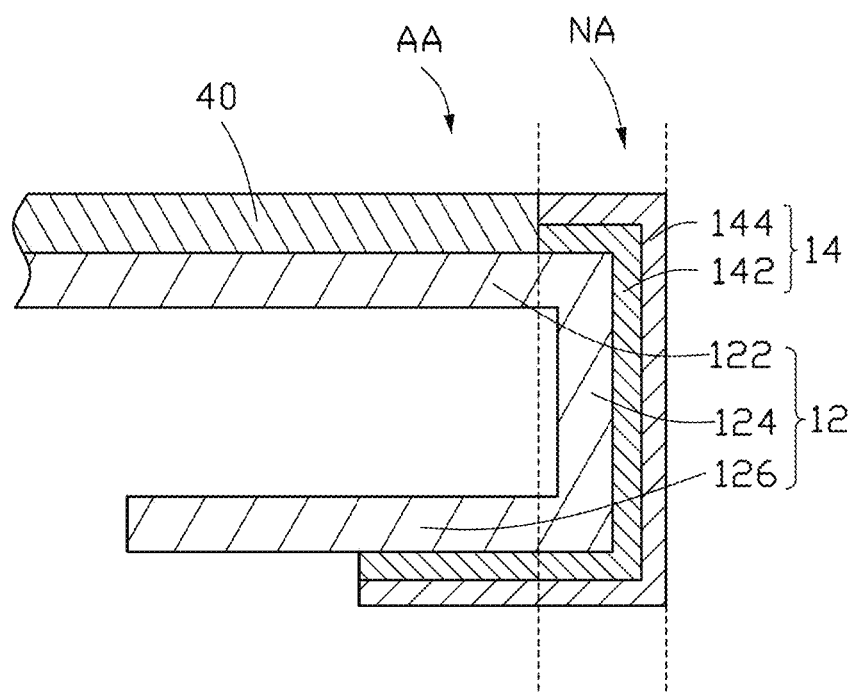
FIG. 15 is a cross-sectional view of part of the display panel in FIG. 14.

FIG. 15 is a sectional view of part of the display panel 100 in FIG. 14. For clarity of description, some elements are omitted in FIG. 15. As shown in FIG. 15, the traces 14 are bent as the substrate 12 is bent. The bendable portion 124 is substantially "C" -shaped after being bent. The binding portion 126 is on a side of the main portion 122 away from the organic light emitting device layer 40. Each trace 14 includes a stretch-resistant layer 142 and a metal layer 144 covered with the stretch-resistant layer 142. The metal layer 144 covers the surface of the stretch-resistant layer 142 away from the substrate 12.

In one embodiment, the material of the stretch-resistant layer 142 is a composite material of metal and polymer, such as conductive silver paste. The material of the metal layer 144 can be, but is not limited to, copper or copper alloy. In other embodiments, the stretch-resistant layer 142 can be, but is not limited to, carbon nanotubes (CNTs), nano-metals (such as nano-silver), conductive polymers (PEDOT), composites of CNTs and PEDOT, composites of nano metals and PEDOT, or composites of nano metals and graphene.

In one embodiment, the stretch-resistant layer 142 is formed by screen printing or laser patterning. The metal layer 144 is formed by chemical plating, electroplating or sputtering combined with a yellow light process.

Because the stretch-resistant layer 142 under the metal layer 144 has good tensile resistance, the resistance of each trace 14 does not change much after being bent multiple times, and the electrical flow is stable. In addition, even if cracks occur on the surface of the metal layer 144 after being repeated flexes, the traces 14 can conduct through the stretch-resistant layer 142. The reliability of the traces 14 is improved, and broken and non-conducting traces 14 are avoided.

Figure 16:
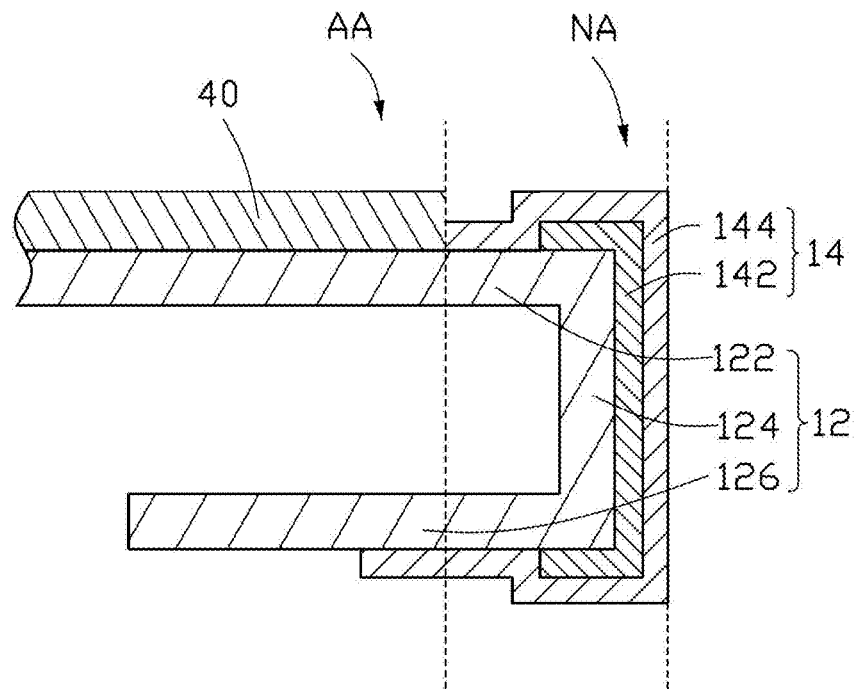
FIG. 16 is a cross-sectional view of part of a display panel according to another embodiment of the present disclosure.

FIG. 16 shows the display panel 100 according to another embodiment. In the display panel 100, the stretch-resistant layer 142 is at least in the foldable area 12c. The metal layer 144 extends beyond the stretch-resistant layer 142 and covers the surface of the substrate 12. That is, the metal layer 144 covers all surfaces of the stretch-resistant layer 142 that are not in contact with the substrate 12 and layer 144 extends beyond the stretch-resistant layer 142. The traces 14 at the bendable portion 124 and the binding portion 126 may have a section including only the metal layer 144 and not including the stretch-resistant layer 142. Since the stretch-resistant layer 142 is arranged at least to correspond to the bendable portion 124, the flex toleration of the traces 14 at the bending 124 is improved.

Figure 17:
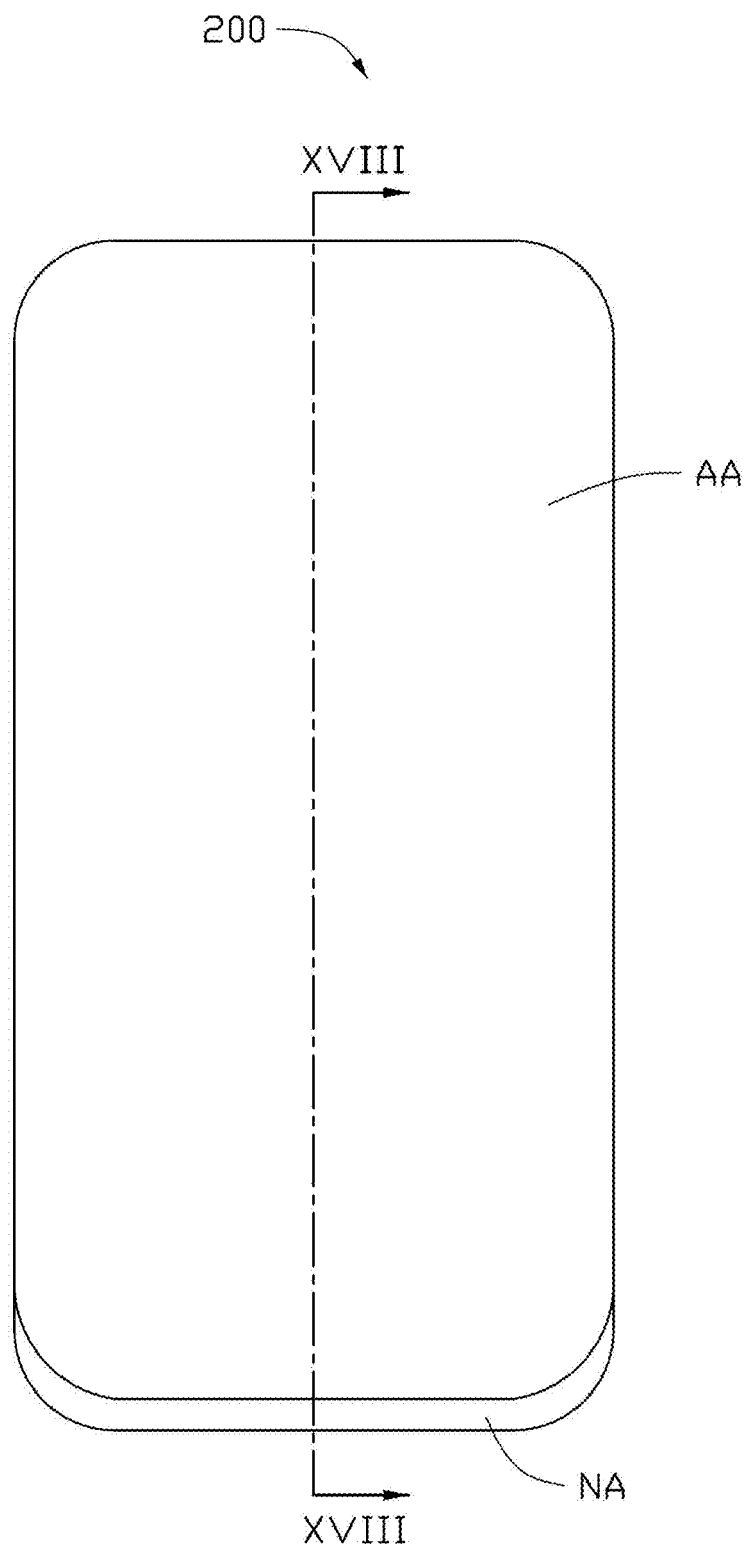
FIG. 17 is a top view of a display panel according to another embodiment of the present disclosure.
Figure 18:
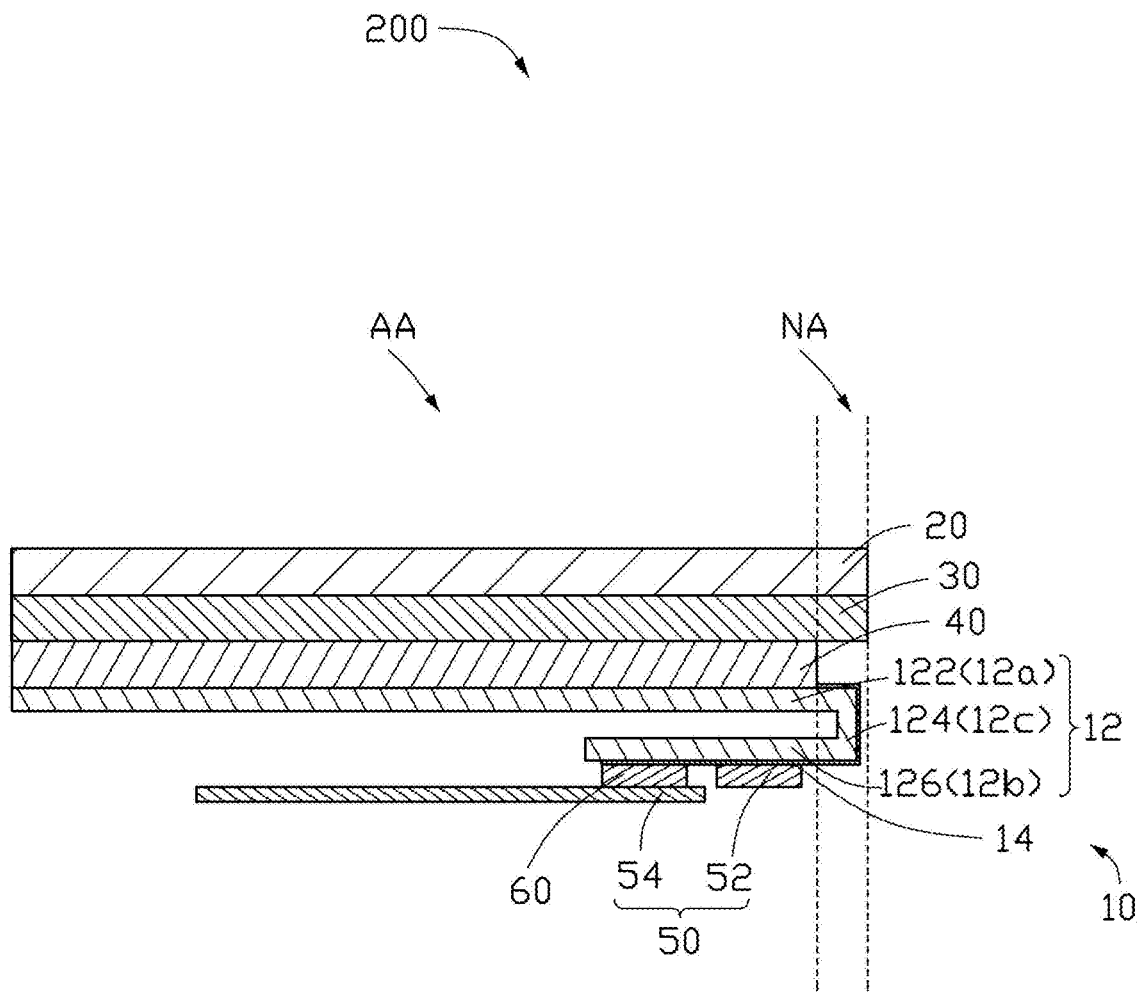
FIG. 18 is a cross-sectional view along line XVIII-XVIII in FIG. 17.

FIG. 17 and FIG. 18 show a display panel 200 according to another embodiment. The difference between the display panel 200 and the display panel 100 is that the display panel 200 only includes a border area NA on one side of the display area AA, which further increases a screen ratio of the display panel 200.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A display panel defining a display area configured for displaying images and a border area surrounding the display area, the display panel comprising:
   a cover plate;
   a substrate on the cover plate, the substrate being flexible and foldable, the substrate comprising a main portion in the display area, a bendable portion extending from the main portion to the border area, and a binding portion connecting the bendable portion and on a side of the main portion away from the cover plate;
   an organic light emitting device layer on a surface of the main portion adjacent to the cover plate;
   a driving circuit on a surface of the binding portion away from the cover plate; and
   a plurality of traces on at least a surface of the bendable portion away from the display area, the plurality of traces being electrically connected to the organic light emitting device layer and the driving circuit;
   wherein each of the plurality of traces comprises a stretch-resistant layer and a metal layer covering the stretch-resistant layer, the stretch-resistant layer is electrically conducting and stretch resistant, and a material of the stretch-resistant layer is selected from composites of carbon nanotubes and conductive polymers, and composites of nano metals and conductive polymers.

2. The display panel according to claim 1, wherein a stretching rate of the stretch-resistant layer is not less than 90%.

3. The display panel according to claim 1, wherein the metal layer extends beyond the stretch-resistant layer and covers a surface of the substrate.

4. The display panel according to claim 1, wherein the driving circuit comprises a driving chip and a flexible circuit board.

5. The display panel according to claim 1, further comprising a touch layer configured for touch sensing, wherein the touch layer is between the organic light emitting device layer and the cover plate, and in the display area and the border area.

6. The display panel according to claim 4, wherein the driving chip is integrated on the substrate by means of a chip on film (COF), the flexible circuit board is bound to the binding portion through a conductive adhesive and is electrically connected with the plurality of traces.

* * * * *